United States Patent
Tokoshima et al.

(10) Patent No.: US 10,180,211 B2
(45) Date of Patent: Jan. 15, 2019

(54) SUPPLY METHOD FOR LIQUID AND SUPPLY APPARATUS

(71) Applicant: KURITA WATER INDUSTRIES LTD., Nakano-ku, Tokyo (JP)

(72) Inventors: Hiroto Tokoshima, Tokyo (JP); Kazuya Ishiwata, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 820 days.

(21) Appl. No.: 14/182,752

(22) Filed: Feb. 18, 2014

(65) Prior Publication Data

US 2014/0230908 A1 Aug. 21, 2014

(30) Foreign Application Priority Data

Feb. 20, 2013 (JP) .................................. 2013-031034

(51) Int. Cl.
  *F17D 1/08* (2006.01)
  *E03C 1/00* (2006.01)

(52) U.S. Cl.
  CPC .................. *F17D 1/08* (2013.01); *E03C 1/00* (2013.01); *Y10T 137/0324* (2015.04); *Y10T 137/3021* (2015.04); *Y10T 137/87652* (2015.04)

(58) Field of Classification Search
  CPC ........................................................ F17D 1/08
  USPC ...................................... 137/2, 896; 138/177
  See application file for complete search history.

(56) References Cited

U.S. PATENT DOCUMENTS

| | | | | | |
|---|---|---|---|---|---|
| 3,481,350 | A | * | 12/1969 | Chamberlain | G05D 11/006 137/101.11 |
| 5,067,508 | A | * | 11/1991 | Lee | F17D 1/17 137/13 |
| 5,979,474 | A | * | 11/1999 | Manako | B08B 3/10 134/102.1 |
| 6,039,815 | A | * | 3/2000 | Yeol | B01F 3/04985 134/1 |

(Continued)

FOREIGN PATENT DOCUMENTS

| | | |
|---|---|---|
| JP | H11-138181 A | 5/1999 |
| JP | H11-166700 A | 6/1999 |

(Continued)

OTHER PUBLICATIONS

Japan Patent Office, "Office Action for Japanese Patent Application No. 2013-031034," dated Oct. 4, 2016.

*Primary Examiner* — Matthew W Jellett
*Assistant Examiner* — Christopher Ballman
(74) *Attorney, Agent, or Firm* — Manabu Kanesaka

(57) ABSTRACT

A solution having a predetermined concentration is stably supplied to a use point, at which the amount of use of the solution changes, by only modifying currently-used equipment at a low cost and in a space-saving manner. In order to supply a solution containing a solute at a predetermined concentration from a preparation portion of the solution to a use point through a supply pipe, a retention portion that has no gas-liquid interface and at which the solution is retained is provided at an intermediate portion of the supply pipe. Even when the amount of use of the solution at the use point changes, the change is absorbed by the retention portion, whereby a solution having a predetermined concentration can be stably supplied to the use point.

7 Claims, 2 Drawing Sheets

(56) References Cited

U.S. PATENT DOCUMENTS

| | | | |
|---|---|---|---|
| 6,086,057 A * | 7/2000 | Mitsumori | B01F 3/04985 210/750 |
| 6,267,142 B1 * | 7/2001 | Wong | H01L 21/67046 134/94.1 |
| 6,290,777 B1 * | 9/2001 | Imaoka | B08B 3/08 134/1 |
| 6,409,918 B1 | 6/2002 | Morita et al. | |
| 6,918,406 B2 | 7/2005 | Bae et al. | |
| 7,237,562 B2 * | 7/2007 | Shibayama | B01D 19/0031 134/102.1 |
| 7,669,776 B2 * | 3/2010 | Beck | G05D 23/1346 137/896 |
| 8,123,833 B2 * | 2/2012 | Morita | B01D 19/0036 134/10 |
| 2010/0126934 A1 * | 5/2010 | Nakazato | C02F 9/00 210/638 |
| 2012/0241013 A1 * | 9/2012 | Linder | B01L 3/502746 137/2 |

FOREIGN PATENT DOCUMENTS

| | | |
|---|---|---|
| JP | 2000-271549 A | 10/2000 |
| JP | 2004-006858 A | 1/2004 |

\* cited by examiner

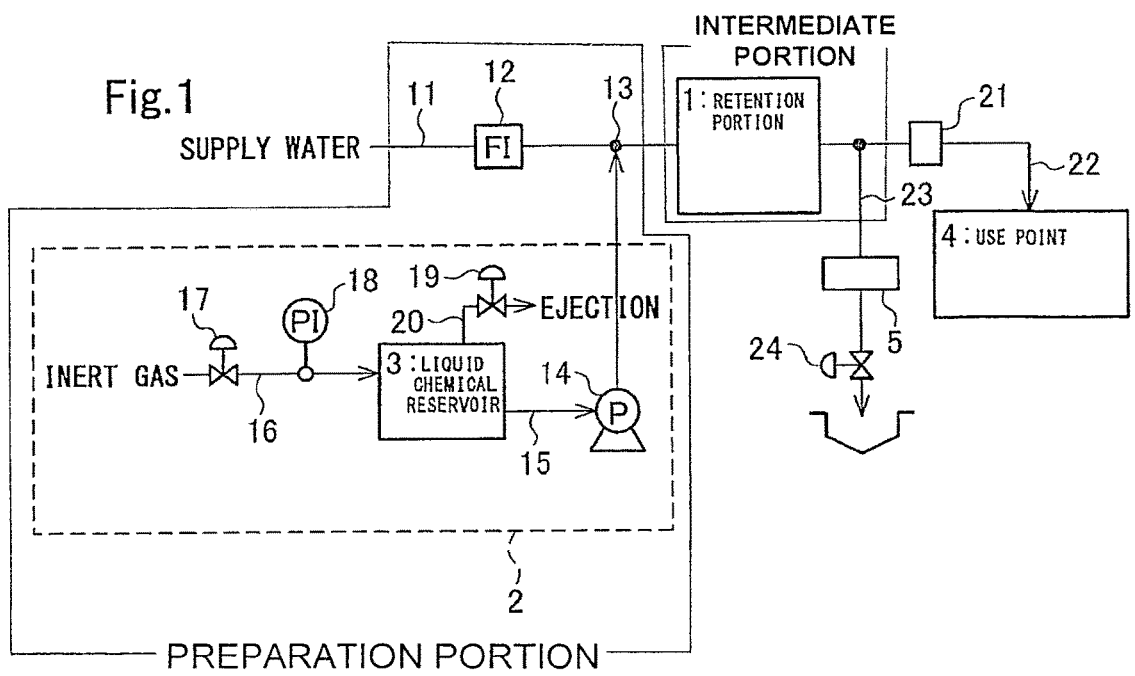

SUPPLY METHOD FOR LIQUID AND SUPPLY APPARATUS

FIELD OF INVENTION

The present invention relates to a supply method for liquid and a supply apparatus, and particularly to a method and an apparatus for stably supplying wash water containing a cleaning component at a low concentration, the cleaning component being used in cleaning of electronic parts or the like requiring high purity, surface reforming, or a surface protection process, examples of the cleaning component including acid, alkali, or a gas such as ozone or hydrogen, and examples of the electronic parts requiring high purity including a silicon wafer for a semiconductor device and a glass substrate for a flat panel display.

BACKGROUND OF INVENTION

To date, a highly concentrated liquid chemical or cleanser has been used in cleaning of substrates serving as electronic parts, surface reforming, or a surface protection process, typically in the RCA clean, and a large amount of pure water or ultrapure water has been used for rinsing the solution or the cleanser. For the purposes of cost reduction in the cleaning process and environmental protection and for other purposes, on the other hand, various simplified cleaning technologies have been developed and accomplished. A typical example of such technologies is a cleaning technology using wash water in which a chemical agent, such as acid or alkali, or a gas, such as ozone or hydrogen, is dissolved in pure water or ultrapure water at a very low concentration. This method reduces the cost of wash water preparation and the cost of waste wash-water disposal as well as reduces, to a large degree, the amount of water used for rinsing after cleaning. This method is also advantageous in that it improves the quality of a substrate surface as it does not involve etching during the cleaning.

The above-described wash water is usually prepared by injecting a cleaning component into a water supply line through which pure water or ultrapure water is supplied from a pure-water manufacturing apparatus or a ultrapure-water manufacturing apparatus, examples of the cleaning component including a chemical agent, such as acid or alkali, and a gas, such as ozone or hydrogen. The prepared wash water is supplied to a use point (use position). In order to achieve a desired cleaning effect, it is important that the concentration of cleaning component in the prepared wash water is constant at a predetermined concentration. Specifically, if the concentration of the cleaning component in the wash water is not constant, the quality of the surfaces of the cleaned electronic parts is affected, decreasing product yields. The injection amount of the cleaning component is thus controlled by controlling means so that wash water containing a cleaning component at a predetermined concentration can be provided, the controlling means acting in conjunction with, for example, a flowmeter provided to a pure/ultrapure water supply line or a cleaning-component concentration sensor provided to a wash-water supply pipe.

Examples of the method for cleaning substrates include batch cleaning and single wafer cleaning. In the batch cleaning, multiple substrates are placed in a special purpose carrier and the substrates in the carrier are collectively cleaned by being immersed in a cleaning bath containing wash water. In the single wafer cleaning, the substrates are cleaned one by one by being placed on a turnable and being sprayed with wash water. In either cleaning, the amount of wash water used by a cleaning device changes in a series of cleaning processes.

Particularly, the single wafer cleaning exerts its cleaning effect by changing the amount of wash water sprayed on substrates or by intermittently spraying wash water in accordance with the cleaning program set on each cleaning device to be used. Thus, the amount of wash water used by the cleaning device changes second by second.

In this manner, in an existing method, wash water is continuously produced at a constant flow rate and directly supplied to a use point while an excess of wash water is expelled in order to stably supply, to the use point, wash water having a constant concentration of cleaning component although the amount of use of wash water changes. In terms of a waste-liquid disposal cost and environmental problems, however, only an amount of wash water required at the use point is desirably supplied without producing excess water that needs disposal.

In order to supply an amount of wash water appropriate for use at the use point, a control mechanism that prepares wash water in accordance with the change in amount of use and supplies the wash water to the use point has to be provided.

A conceivable example of preparing wash water having a constant concentration and supplying the wash water to the use point is as follows. The amount of supply of pure water or ultrapure water is changed in accordance with the amount of use of wash water with the above-described existing method for supplying wash water, while means for controlling the injection amount of cleaning component in conjunction with a flowmeter provided at a water supply line controls the injection amount of cleaning component in accordance with the change in flow rate of pure water or ultrapure water supplied through the water supply line.

However, preparing and supplying wash water having a constant concentration to the use point is difficult by only controlling, in conjunction with the above-described flowmeter, the injection amount of cleaning component to be injected into supply water having a flow rate that changes. Thus, the concentration of the cleaning component in the prepared wash water unavoidably becomes inconstant in accordance with the change in flow rate of supply water. Particularly, when a diluted solution containing a cleaning component at a very low concentration is used as the wash water, the management of the concentration becomes extremely difficult.

An existing method developed to cope with the change in amount of use of wash water is to provide a buffer tank, serving as a container at which wash water stands by before being supplied to the use point, to a wash-water supply pipe so that the buffer tank absorbs the excess of wash water, which is supplied at a constant flow rate, that occurs due to the change in flow rate, or so that the excess of wash water is allowed to be returned upstream from the buffer tank (Patent Literature 1 and 2).

However, electronic parts are cleaned in a highly purified clean room and the equipment occupying the clean room is desired to be space-saving. Thus, providing the buffer tank, the circulation line, and auxiliary equipment for these, as in the cases of Patent Literatures 1 and 2, is not preferable in terms of not only cost but also space saving.

LIST OF LITERATURE

[Patent Literature 1] Japanese Patent Publication H11-166700A

[Patent Literature 2] Japanese Patent Publication 2000-271549A

OBJECT AND SUMMARY OF INVENTION

Accordingly, an object of the present invention is to provide a supply method for liquid and a supply apparatus that solve the above-described existing problems and with which a solution having a predetermined concentration can be stably supplied to a use point, at which the amount of use of the solution changes, by only modifying currently-used equipment at a low cost and in a space-saving manner.

As a result of diligent study to solve the above-described problems, the inventors have found that the above-described problems can be solved by providing a space-saving retention portion to a solution supply pipe and absorbing, with the retention portion, the change in amount of use of the solution at the use point. The inventors have thus accomplished the invention.

Specifically, the invention is summarized as follows.

[1] A supply method for supplying a solution containing a solute at a predetermined concentration from a preparation portion of the solution to a use point through a supply pipe, wherein a retention portion that has no gas-liquid interface and at which the solution is retained is provided at an intermediate portion of the supply pipe.

[2] In the supply method according to [1], the retention portion is a long pipe portion.

[3] In the supply method according to [2], a pipe of the long pipe portion is wound around.

[4] In the supply method according to [1], the retention portion is a portion of the supply pipe having a larger diameter than diameters of other portions of the supply pipe.

[5] In the supply method according to any one of [1] to [4], the retention portion has such a capacity that retention time for which the solution is retained in the retention portion is 0.1 to 5 minutes when a maximum amount of the solution is used at the use point.

[6] In the supply method according to any one of [1] to [5], the solution is wash water used in cleaning of an electronic component.

[7] A supply apparatus for supplying a solution, including solution preparation means for preparing a solution containing a solute at a predetermined concentration and a supply pipe through which the solution prepared by the solution preparation means is supplied to a use point, wherein a retention portion having no gas-liquid interface and at which the solution is retained is provided at an intermediate portion of the supply pipe.

[8] In the supply apparatus according to [7], the retention portion is a long pipe portion.

[9] In the supply apparatus according to [8], a pipe of the long pipe portion is wound around.

[10] In the supply apparatus according to [7], the retention portion is a portion of the supply pipe having a larger diameter than diameters of other portions of the supply pipe.

[11] In the supply apparatus according to any one of [7] to [10], the retention portion has such a capacity that retention time for which the solution is retained in the retention portion is 0.1 to 5 minutes when a maximum amount of the solution is used at the use point.

[12] In the supply apparatus according to any one of [7] to [11], the solution is wash water used in cleaning of an electronic component.

ADVANTAGEOUS EFFECTS OF INVENTION

According to the present invention, even when the amount of use of the solution at the use point changes, the change is absorbed by the retention portion, whereby the solution having a predetermined concentration can be stably supplied to a use point. Such a retention portion is advantageous in terms of space saving since the retention portion can be formed by using, for example, a long pipe portion or a large-diameter portion of a pipe having no gas-liquid interface. Such a retention portion can be installed in existing equipment at a low cost by only slightly modifying an intermediate portion of a supply pipe.

The supply method for liquid and the supply apparatus according to the present invention are useful as a method and an apparatus for supplying wash water containing a cleaning component at a low concentration to a cleaning device, which is a use point, for use particularly in cleaning components such as electronic parts requiring high purity, surface reforming, or a surface protection process, examples of the electronic parts including silicon wafers for semiconductor devices and glass substrates for flat panel displays, examples of the cleaning component including acid, alkali, or a gas such as ozone or oxygen. The method and the apparatus according to the invention are particularly effective at supplying wash water to a single wafer cleaning device that changes the amount of use of wash water second by second.

BRIEF DESCRIPTION OF DRAWINGS

FIG. 1 is a system diagram of a supply method for liquid and a supply apparatus according to an embodiment of the invention.

DESCRIPTION OF EMBODIMENTS

Figure 2A:
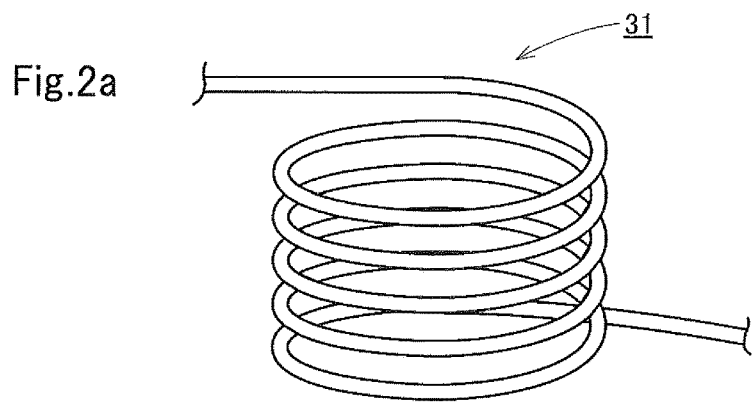
FIGS. 2a, 2b, and 2c are perspective views of a retention portion

Referring now to the drawings, a supply method for liquid and a supply apparatus according to an embodiment of the invention will be described below in detail.

The example described below is a case where a supply method for liquid and a supply apparatus according to the invention are used to supply wash water as a solution for cleaning electronic parts in a semiconductor manufacturing process or the like. The solution supplied in the present invention, however, is not particularly limited to the wash water. For example, the invention is applicable to the case of stably supplying a diluted solution required in manufacture in the field of medicine or food, or in other fields.

In FIG. 1, wash water is prepared by injecting a liquid chemical into supply water. However, wash water may be gas-solubility water prepared by injecting a gas into supply water.

In FIG. 1, supply water supplied through a pipe 11 is not limited to a particular type and may be any supply water that has a quality appropriate for the purpose of use. In the semiconductor manufacturing process, ultrapure water is usually used. Although the material of the pipe 11 is not limited to a particular type, a material such as perfluoroalkoxy alkane fluoroplastic (PFA), polyvinylidene fluoride (PVDF), or clean polyvinyl chloride (PVC) is typically used as the material.

The flow rate of the supply water is measured by a flowmeter 12 and the supply water is transported to a retention portion 1 via a liquid-chemical injection point 13. Although the flowmeter 12 is not limited to a particular type, a flowmeter such as a resin-made vortex flowmeter or ultrasonic flowmeter is usually used to prevent metal elution or particle occurrence.

At the injection point 13, a liquid-chemical injection control system 2 injects a liquid chemical (a solution containing a chemical agent, which is a cleaning component, at a high concentration). The liquid-chemical injection control system 2 is not limited to a particular type and may be any system that can control, with desired accuracy, injection of a liquid chemical into the supply water in the pipe 11 so that the resultant solution has a desired concentration. In FIG. 1, such a control is made that the liquid chemical in a liquid chemical reservoir 3 is injected by a liquid-chemical injection pump 14 through a liquid chemical pipe 15. The method for storing a liquid chemical is not limited to a particular way. In the case of FIG. 1, in order to maintain the quality of the stored liquid chemical, an inert gas supplied from an inert-gas supply pipe 16 and having a flow rate and a pressure that have been adjusted after having passed through an inert-gas-amount adjustment valve 17 and an inert-gas-pressure adjustment system 18 is supplied to a gas phase portion of the liquid chemical reservoir 3. A nitrogen gas is usually used as an inert gas. The inert gas ejected from the gas phase portion of the liquid chemical reservoir 3 is maintained by a pressure maintenance system (pressure adjustment valve) 19 so that the reservoir 3 is maintained at a positive pressure. An excess of the inert gas is ejected from an ejection pipe 20.

The liquid chemical is supplied to the injection point 13 of the supply pipe 11 through the liquid-chemical injection pipe 15 while the injection amount of the liquid chemical is controlled with the liquid-chemical injection pump 14 on the basis of the value so calculated that the solution has a desired concentration from the flow rate of supply water (that is, the value measured by the flowmeter 12) and the liquid chemical concentration in the liquid chemical reservoir 3.

Liquid contact portions of the liquid chemical tank 3, the liquid-chemical injection pipe 15, and the liquid-chemical injection pump 14 are made of components resistant to the liquid chemical. Preferable examples of the material of the components usually include PVDF, polytetrafluoroethylene (PTFE), and PFA.

The diluted liquid chemical used as wash water is prepared at the injection point 13, flows through the retention portion 1, filters through a filter 21, flows through a wash water supply pipe 22, and is then supplied to the use point 4. Although not essential, the filter 21 is usually installed at the inlet side of the use point 4. The filter 21 is not limited to a particular type and may be any filter that is resistant to the liquid chemical. Typical examples of the filter 21 include those made of PTFE or PFA. The filtration performance of the filter 21 is determined in accordance with the purpose of the filter. Typically, for the purpose of cleaning semiconductor parts, filters having pores whose diameter is 50 nm or lower are usually used.

At the second side (downstream side) of the retention portion 1, the concentration of the chemical agent in the wash water is monitored by a concentration monitor 5. Specifically, part of wash water is extracted from a monitoring pipe 23 diverged from the wash water supply pipe 22 and monitored by the concentration monitor 5. Reference numeral 24 denotes a flow rate adjustment valve of the concentration monitor 5. The concentration monitor 5 does not have to be a monitor that directly measures the concentration of the chemical agent in the wash water and may be another monitor that can find the correlation with the concentration of the chemical agent. For example, a pH meter or a conductivity meter is usable. Particularly, when the supply water is ultrapure water, a conductivity meter is preferably used.

The liquid chemical in the liquid chemical reservoir 3 may be injected to the injection point 13 by pressurizing the tank so that the injection amount of the chemical is controlled by a precision control valve such as a liquid mass-flow controller.

Examples of the method for controlling the injection amount of the liquid chemical include a method for controlling the injection amount in accordance with the change in flow rate of supply water and a method for controlling the injection amount in such a manner that the concentration monitor displays a constant value. The method for controlling the injection amount is selected in accordance with a desired concentration or accuracy and is not particularly limited.

At an intermediate portion of the wash water supply pipe 11, that is, at a portion between the liquid-chemical injection point 13 of the pipe 11 and the use point 4, a retention portion 1 having no gas-liquid interface is provided. The existence of the retention portion 1 enables absorption of the change in concentration even when the amount of use of wash water at the use point 4 changes, so that wash water containing the chemical agent at a desired concentration can be stably supplied to the use point 4.

Unlike a reservoir such as an existing buffer tank, the retention portion 1 according to the present invention can be a portion having no gas-liquid interface and formed into a shape such as a pipe, which is space saving and cost saving.

The shape of the retention portion 1 is not limited to a particular shape and may be any that enables retention of wash water in the supply pipe at a predetermined position for a predetermined period of time. The retention portion 1 may be a reservoir such as a prismatic tank or a columnar tank as long as it has no gas-liquid interface. However, use of a long pipe portion or a large-diameter portion of the supply pipe is preferable because the retention portion can thus be installed easily at a low cost.

Figure 2B:
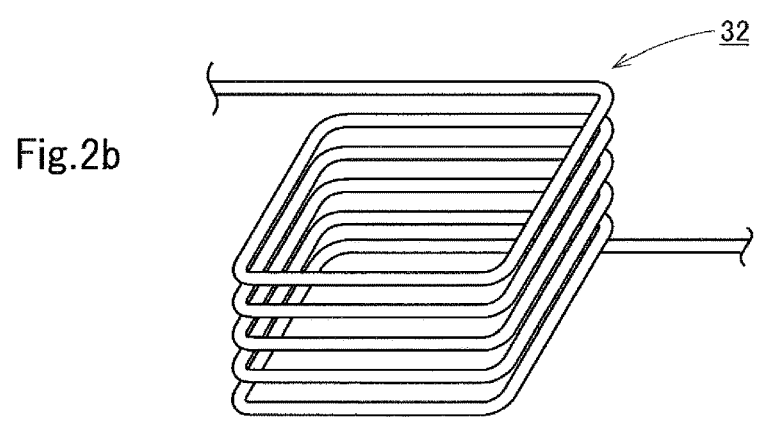
Figure 2C:
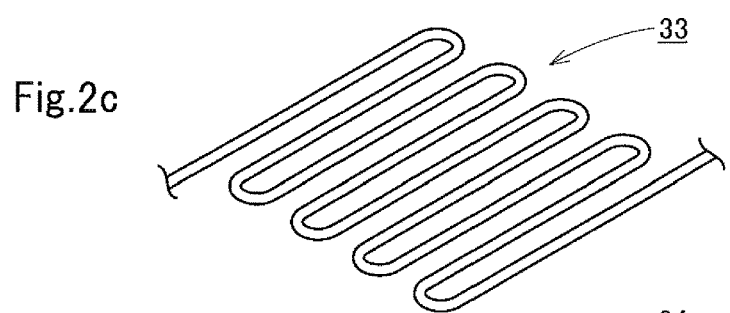

Usable examples of such a retention portion include a retention portion 31 illustrated in FIG. 2a, which is a long pipe that is wound around in a circular spiral form (in a coil form), and a retention portion 32 illustrated in FIG. 2b, which is a long pipe that is wound around in an angular, for example, quadrangular spiral form. Alternatively, the retention portion may be a retention portion 33, which is a long pipe bent in a serpentine form as illustrated in FIG. 2c.

Alternatively, the axis of the spiral of each of the retention portions 31 and 32 illustrated in FIG. 2a and FIG. 2b may extend in the direction from the left to right in FIGS. 2a and 2b. Besides the retention portion 33 illustrated in FIG. 2c in which the serpentine form continues in the horizontal direction, a retention portion 33 having a serpentine form that continues in the vertical direction may be used.

The long pipe of the retention portion formed by using such a long pipe portion may be a pipe having the same diameter as that of the supply pipes in front and at the rear of the retention portion (upstream and downstream from the retention portion), but may appropriately have a different pipe diameter. However, in terms of installation of the retention portion, the use of the pipe having the same diameter is preferable.

Figure 2D:
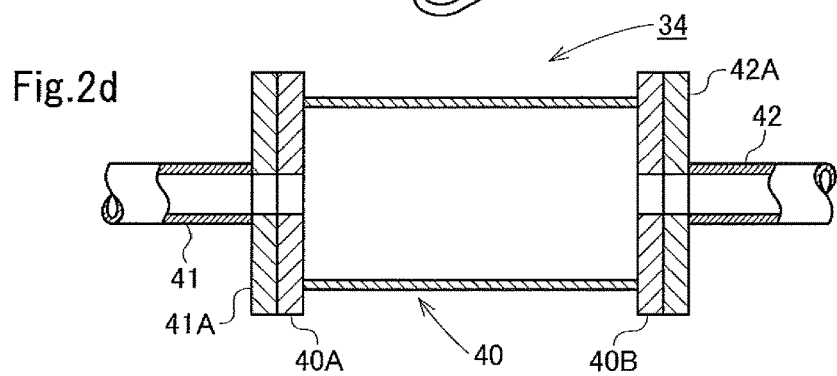
FIG. 2d is a cross-sectional view of the retention portion.

The retention portion according to the present invention may be a large-diameter portion of a supply pipe. In this case, as illustrated in FIG. 2d, a retention portion 34 formed by using a large-diameter pipe portion can be used in which a large-diameter pipe 40 having flanges 40A and 40B is interposed between a flange 41A of an upstream-side supply pipe 41 and a flange 42A of a downstream-side supply pipe 42.

The liquid contact portions of such retention portions are preferably made of a material similar to the above-described material of the pipe 11 because such a material is free from problems such as metal elution or particulate contamination.

The capacity of the retention portion 1 is appropriately determined in accordance with conditions such as the range of the change in amount of use of wash water at the use point 4, the response ability of the liquid-chemical injection control system 2, and the size of the entire equipment. If the capacity of the retention portion is too small and the retention time of wash water in the retention portion is too short, the provision of the retention portion does not bring about a full effect of absorbing the change in amount of use at the use point. If the capacity of the retention portion is too large, on the other hand, the size of the apparatus increases, preventing the space-saving purpose of the present invention.

Thus, it is preferable that the capacity of the retention portion be appropriately determined so that wash water can be reliably retained in the retention portion, when a maximum amount of wash water is used at the use point, for the retention time of approximately 0.1 to 5 minutes, particularly, 0.3 to 3 minutes, more particularly, on the order of 0.5 to 3 minutes.

In the case of a retention portion having a large-diameter pipe as illustrated in FIG. 2d, a large-diameter pipe having a diameter 2 to 30 times as large as the diameter of the supply pipes in front and at the rear of the retention portion and having a length approximately 1 to 10 times the pipe diameter may be used.

By providing this retention portion 1, the change in amount of use of wash water at the use point 4 with respect to the amount of supply water supplied at a constant flow rate is absorbed in a water supply line including the pipe 11, the retention portion 1, and the pipe 22 due to the change in flow velocity at various portions in the pipes and retention at the retention portion 1. Even in the case where the injection amount of liquid chemical injected from the liquid-chemical injection point 13 fails to be fully controlled in accordance with the change in flow velocity due to the change in flow rate and the concentration of the chemical agent in wash water changes consequently, this change in concentration of the chemical agent is moderated while the wash water is retained in the retention portion 1 and passes through the retention portion 1, so that wash water having a constant concentration of the chemical agent is supplied to the use point 4.

In the present invention, the type of the solution supplied to the use point is not particularly limited. Examples of wash water used in cleaning of electronic parts include diluted cleaning solutions in which a cleaning component is dissolved in pure water or ultrapure water at, for example, the following concentrations, examples of the cleaning component including acid, such as hydrochloric acid, sulfuric acid, nitric acid, or phosphoric acid, alkali, such as ammonia, tetramethylammonium hydroxide (TMAH), or choline, an oxidizer such as hydrogen peroxide, or a gas such as ozone, gaseous oxygen, gaseous hydrogen, gaseous nitrogen, gaseous chlorine, carbonic acid gas, or a noble gas such as argon.

Concentration of acid: 0.01 to 1000 mg/L
Concentration of alkali: 0.01 to 1000 mg/L

EXAMPLES

The present invention will be described more specifically using the following examples.

Example 1

Wash water was supplied to the use point by the wash water supply apparatus illustrated in FIG. 1 under the following conditions.

Supply water: ultrapure water
Flow rate of supply water: 1 to 30 L/min
Chemical agent: ammonia
Concentration of chemical agent of liquid chemical in liquid chemical reservoir: 1000 mg/L
Concentration at injection (concentration of chemical agent in wash water): 10 mg/L
Liquid-chemical injection pump: "EHN-B11" from IWAKI Co., Ltd.
Retention portion: large-diameter pipe illustrated in FIG. 2d
Filter: "Ultipleat SP DR" from Nihon Pall Ltd. (pore diameter 30 nm)

In this example, in order to increase an effect of the change in amount of use of water at the use point so that the degree of the change in concentration of the chemical agent in wash water due to the change in flow rate is clarified, the flow rate of supply water from the pipe 11 was changed within the range of 1 to 30 L/min and the injection of the liquid chemical was controlled in accordance with the flow rate of supply water. The injection amount of liquid chemical was so controlled that wash water having a constant ammonia concentration of 1 mg/L was prepared: for example, when the flow rate of supply water was 30 L/min, the injection amount of liquid chemical (ammonia water at the concentration of 1000 mg/L) was determined to be 300 mg/L, whereas when the flow rate of supply water was 1 L/min, the injection amount of liquid chemical was determined to be 10 mg/L.

The size of the large-diameter pipe of the retention portion 1 was changed in various manners as illustrated in Table 1 within the range in diameter of 10 to 40 cm and the range in length of 30 to 150 cm, so that the retention time at the flow rate of supply water of 30 L/min satisfies the time indicated in Table 1.

A conductivity meter was used as the concentration monitor 5 to detect the ammonia concentration in the prepared wash water by on-line monitoring and performing an off-line ion chromatography analysis.

Table 1 shows the detection results of the range of the change in ammonia concentration in wash water supplied to the use point 4 when the flow rate of supply water changes in the range of 1 to 30 L/min with respect to the corresponding retention time at the retention portion 1.

TABLE 1

| Pipe diameter (cm) · length (cm) of retention portion | Retention time at retention portion (minute) | Ammonia Concentration in wash water (mg/L) |
|---|---|---|
| 10 × 30 | 0.1 | 1~80 |
| 10 × 60 | 0.2 | 2~60 |
| 10 × 90 | 0.3 | 5~40 |
| 10 × 150 | 0.5 | 7~30 |
| 20 × 100 | 1 | 8~20 |
| 30 × 90 | 2 | 9~15 |
| 30 × 130 | 3 | 9~13 |
| 40 × 120 | 5 | 9~12 |

Table 1 shows that providing a retention portion having retention time of approximately 0.1 to 5 minutes, preferably approximately 0.5 to 3 minutes, enables reduction of the change in ammonia concentration in wash water and supply of wash water having a constant concentration to the use point.

Comparative Example 1

Wash water was similarly supplied in the same manner as in Example 1 except that a circulation tank having a capacity of 30 L was provided instead of the retention portion and the prepared wash water was so supplied that the liquid level in the circulation tank became constant.

In Comparative Example 1, the flow rate of supply water supplied to the use point was set to be constant, the excess of wash water that remained unused at the use point was returned to the circulation tank, and the circulation tank was replenished with an equal amount of wash water used at the use point to keep the liquid level in the circulation tank constant.

In Comparative Example 1, the range of the change in ammonia concentration in wash water was 8 to 20 mg/L, which is equivalent to the range in the case where a retention portion having retention time of one minute according to Example 1 is provided. Nevertheless, Comparative Example 1 required the following circulation tank and ancillary facilities for the tank for circulation of wash water. The tank and the ancillary facilities occupied a space two times as large as the space for the retention portion of Example 1, and installation of these costed five times as much as the installation of the retention portion.

The circulation tank is provided with the following ancillary facilities:

a liquid level indicator in a circulation tank;

means for supplying an inert gas to the circulation tank (an inert gas supply pump, a supply pipe, and means for sealing in the gas ("seal pot" from Kurita Water Industries Ltd.);

means for adjusting the water temperature in the circulation tank ("fluoro-X FXR/M/F-185" from Junkosha);

a circulation pump ("MDM-25" from IWAKI Co., Ltd); and a circulation pipe (a return pipe from the use point to the circulation tank).

Although the present invention has been described in detail using specific embodiments, it is obvious for persons having ordinary skill in the art that various modifications can be made without departing from the intention and the scope of the invention.

This application is based on Japanese Patent Application No. 2013-031034 filed Feb. 20, 2013, which is incorporated by reference herein in its entirety.

The invention claimed is:

1. A supply method for supplying a solution containing a solute at a predetermined concentration from a preparation portion of the solution to a use point through a supply pipe, the method comprising:
  supplying an inert gas to a liquid chemical stored in a reservoir and producing the solute;
  mixing water and the solute at a liquid-chemical injection point, thereby producing the solution;
  supplying the solution to a retention portion disposed in a downstream of the liquid-chemical injection point; and
  absorbing a change in concentration of the solute in the solution by the retention portion when an amount of use of the solution at the use point changes, thereby supplying the solution containing the solute at the predetermined concentration to the use point,
  wherein the retention portion has no gas-liquid interface, and
  the solution is retained in the retention portion at an intermediate portion of the supply pipe.

2. The supply method according to claim 1, wherein the retention portion is a long pipe portion.

3. The supply method according to claim 2, wherein a pipe of the long pipe portion is wound around.

4. The supply method according to claim 1, wherein the retention portion is a portion of the supply pipe having a larger diameter than diameters of other portions of the supply pipe.

5. The supply method according to claim 1, wherein the retention portion has such a capacity that retention time for which the solution is retained in the retention portion is 0.1 to 5 minutes when a maximum amount of the solution is used at the use point.

6. The supply method according to claim 1, wherein the solution is wash water used in cleaning of an electronic component, surface refining, or a surface protection process.

7. The supply method according to claim 1, further comprising monitoring a concentration of the solute at a downstream-side of the retention portion.

* * * * *